United States Patent
Claprood

(10) Patent No.: US 6,356,441 B1
(45) Date of Patent: Mar. 12, 2002

(54) DISK DRIVE ASSEMBLY WITH IMPROVED SECURING AND RELEASING MECHANISM

(75) Inventor: Edward Claprood, Southborough, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 09/551,720

(22) Filed: Apr. 18, 2000

(51) Int. Cl.[7] .............................. G06F 1/16; H05K 7/14
(52) U.S. Cl. ...................... 361/685; 361/726; 361/801; 361/747; 361/732; 360/137; 360/137 D; 312/332.1; 312/333; 369/75.1
(58) Field of Search ................................ 361/685, 726, 361/747, 754, 759, 801, 796, 755, 729, 730, 732, 752; 360/137, 137 D; 312/332.1, 333; 248/618, 633–638; 369/75.1–82

(56) References Cited

U.S. PATENT DOCUMENTS

| | | | | |
|---|---|---|---|---|
| 3,575,482 A | * | 4/1971 | MacMaster et al. | 312/320 |
| 5,321,962 A | * | 6/1994 | Ferchau et al. | 361/726 |
| 5,359,492 A | * | 10/1994 | Porter | 368/683 |
| 5,576,938 A | * | 11/1996 | Beun | 361/752 |
| 5,717,570 A | * | 2/1998 | Kikinis | 361/685 |
| 5,721,669 A | * | 2/1998 | Becker et al. | 361/685 |
| 5,868,261 A | * | 2/1999 | Collins et al. | 211/26 |
| 6,052,278 A | * | 4/2000 | Tanzer et al. | 361/685 |
| 6,058,016 A | * | 5/2000 | Anderson et al. | 361/727 |
| 6,067,225 A | * | 5/2000 | Reznikov et al. | 361/685 |
| 6,181,549 B1 | * | 1/2001 | Mills et al. | 361/683 |
| 6,288,902 B1 | * | 9/2001 | Kim et al. | 361/725 |

* cited by examiner

Primary Examiner—Leo P. Picard
Assistant Examiner—Lisa Lea-Edmonds
(74) Attorney, Agent, or Firm—Chapin & Huang, L.L.C.; David E. Huang

(57) ABSTRACT

The invention is directed to latching techniques that respond to ergonomically pleasing user movements, and that are well-suited for maintaining low manufacturing costs. One arrangement of the invention is directed to a disk drive assembly having a housing, a disk drive attached to the housing, and a lever that secures the housing to and releases the housing from a main assembly. The lever includes a frame pivotably that is coupled to the housing at a pivot point that defines a pivot axis. The lever further includes a latch that is coupled to the frame. The latch selectively engages with the housing and disengages from the housing. The latch includes an actuation portion that requires movement in a direction along an axis that is substantially perpendicular to the pivot axis to disengage the latch from the housing. Accordingly, if the pivot axis is horizontally-oriented, a user can move the actuation portion in a vertical direction, e.g., downward, in an ergonomically convenient manner to disengage the latch from the housing.

20 Claims, 8 Drawing Sheets

DISK DRIVE ASSEMBLY WITH IMPROVED SECURING AND RELEASING MECHANISM

BACKGROUND OF THE INVENTION

A typical computer system includes a data storage system (or subsystem) having one or more disk drives. Some data storage systems allow a user to install or remove a disk drive in a relatively quick manner without handling any cables or screws. FIG. 1 shows a conventional data storage system 20 which has relatively quick disk drive installation and removal capabilities. The data storage system 20 includes a disk drive assembly 22 and a main assembly 24. The disk drive assembly 22 includes a housing 26, a disk drive 28, a daughter card 30 and a lever 32. The main assembly 24 includes a support structure 34 that defines (i) an opening 36 through which the disk drive assembly 22 enters and exits the housing 34, and (ii) a back end 38. The main assembly 24 further includes a connector 40 which mounts to the back end 38 of the support structure 34, and a post 44 (e.g., a metallic bar) that fastens to a side or edge of the support structure opening 36.

A user can install the disk drive assembly 22 into the main assembly 24, or remove the disk drive assembly 22 from the main assembly 24, by operating the lever 32 and sliding the disk drive assembly housing 26 through the opening 36 of the main assembly support structure 34. The housing 26 includes guides 46, 48 which facilitate motion of the housing 26 within the support structure 34. In particular, the guides 46 align with corresponding guides within the support structure 34 (corresponding guides not shown) to properly align the disk drive assembly 22 within the support structure 34. Furthermore, the guide 48 (and guides 46 to some extent) reduces friction between surfaces of the disk drive assembly housing 26 and the support structure 34.

When the disk drive assembly 22 is properly installed within the main assembly 24, a connecting portion 50 of the daughter card 30 mates with the slot 42 of the connector 40. Contacts along the connecting portion 50 make electrical contact with corresponding contacts within the connector 40. In this mated position, the disk drive assembly 22 is capable of receiving power and communicating with other devices (e.g., a processor) through the connector 40 in order to perform data storage and retrieval operations. The daughter card 30 operates as an interface between the other devices and the disk drive 28. Further details of how the disk drive assembly 22 installs into the main assembly 24 and removes from the main assembly 24 will now be provided with reference to FIGS. 1, 2A and 2B.

As shown in FIG. 1, the lever 32 fastens to the housing 26 via hardware 52 which allows the lever 32 to pivot around a horizontally-oriented pivot axis 54. The lever 32 has a left side and a right side (collectively, sides 62) through which the hardware 52 is mounted. Each side 62 includes a large finger 56 that defines, in combination with a lower edge 60 of the lever 32, a groove 58 at the bottom of the lever 32.

To install the disk drive assembly 22 into the main assembly 24, the user initially positions the lever 32 away from the housing as shown in FIG. 2A. The user then slides the disk drive assembly 22 into the main assembly support structure 34 until the post 44 fits within the groove 58 on each side 62 of the lever 32. The user then pushes on the lever 32 such that the lever 32 rotates about the pivot axis 54 toward the housing 26. As the user pushes on the lever 32, the large fingers 56 of the lever 32 grab the post 44 thus enabling the lever 32 to provide leverage to move the housing 26 further into the support structure 34. Such movement causes the connecting portion 50 of the daughter card 30 to properly mate with the connector 40 in a controlled and consistent manner.

As shown in FIG. 1, the lever 32 includes a pinch-type latch mechanism 64 having a pair of spring-loaded pinch members 66. Each pinch member 66 includes a tapered tabbed end 72 (see FIG. 2A). The tapered tabbed ends 72 align with an opening 70 defined by the housing 26, and are narrower toward the opening 70. As such, when the user pushes the lever 32 toward to the housing 26 to install the disk drive assembly 22 within the main assembly 24, the tapered tabbed ends 72 pass through the opening 70. That is, friction from the housing 26 (i.e., the sides of the opening 70) pushes the ends 72 toward each other to compress a small spring (not shown) which is disposed between the pinch members 66 until the ends 72 pass through the opening 70. Then, the tapered tabbed ends 72 spring back to lock the lever 32 to the housing 26, as shown in FIG. 2B.

In FIG. 2B, the disk drive assembly 22 is secured to the main assembly 24. That is, lever 32 is locked to the housing 26 and is now prevented from pivoting around the pivot axis 54. Furthermore, the large fingers 56 of the lever 32 extend against the post 44 preventing the disk drive assembly 22 from inadvertently disconnecting from the main assembly 24 (e.g., due to vibration).

The lever 32 further includes an area 68 (see FIG. 1) which is capable of supporting a light emitting diode (LED) assembly (not shown) to provide operation information to the user when the disk drive assembly 22 is installed and in operation.

To remove the disk drive assembly 22 from the main assembly 24, the user grabs the pinch members 66 of the pinch-type latch mechanism 64 (e.g., using a thumb and forefinger), squeezes (or pinches) the pinch members 66 together along an axis 67 that is horizontal and parallel to the pivot axis 54, and pulls the lever 32 away from the housing 26. In response to the user's movements, the tapered tabbed ends 72 of the pinch members 66 move toward each other enabling the tabbed ends 72 to pass through the opening 70, and enabling the lever 32 to pivot away from the housing 26 about the pivot axis (see again FIG. 2A). As the lever 32 pivots away from the housing 26, the edge 60 of the lever pushes against the post 44 to provide leverage that moves the disk drive assembly 22 away from back end 38 of the support structure 34 in a controlled and consistent manner. Accordingly, the portion 50 of the daughter card 30 disconnects from the slot 42 of the connector 40, and the disk drive assembly 22 slides out of the main assembly 24. The user then lifts the disk drive assembly 22 away from the main assembly 24 to complete the removal process.

It should be understood that the above-described operation of the lever 32 requires the user to possess considerable hand and wrist strength and coordination. In particular, the user must apply force in three directions: in two opposite directions along the horizontal axis 67 by squeezing the pinch member 66 to disengage the latch mechanism 64 from the housing 26, and in an outward direction to pivot the lever 32 away from the housing 26.

In some maintenance situations, the user may wish to install or remove several disk drive assemblies 22 in a row (e.g., into or out of one or more rows or columns of side-by-side main assemblies 24). In a situation in which multiple disk drive assemblies 22 must be removed, the user can squeeze and pull on the latch mechanisms 64 of each disk drive assembly 22 until that disk drive assembly 22 disconnects from the connector 40 of the corresponding main assembly 24, and then partially slide that disk drive assembly 22 through the main assembly 36 without fully removing that disk drive assembly 22 from the main assembly 24. Once the user has disconnected each disk drive assembly 22 in this manner, the user can then remove the disk drive assemblies 22 by sliding each disk drive assembly 22 fully out of its corresponding main assembly 24.

SUMMARY OF THE INVENTION

Unfortunately, there are drawbacks to conventional data storage systems that use disk drive assemblies with levers having spring-loaded, pinch-type latch mechanisms. For example, such a latch mechanism is complex and costly to manufacture. In particular, the pinch-type latch mechanism includes multiple moving parts (e.g., tabbed pinch members, a small spring, etc.) which must be properly molded, positioned and fastened together to operate correctly. Often, such assembly, and perhaps subsequent repair, requires special equipment and tools which increase the cost of manufacturing and servicing the pinch-type latch mechanism.

Additionally, the conventional pinch-type latch mechanism is difficult and time consuming to operate. In particular, to remove the disk drive assembly from a main assembly of the data storage system, the user is required to provide an unnatural positioning of the hand, and an uncomfortable twisting or squeezing motion by fingers of the hand. That is, the user must (i) grab a pair of pinch members on a lever that pivots around a horizontal pivot axis of the disk drive assembly, (ii) squeeze the pinch members toward each other in opposite horizontal directions such that tabbed ends of the pinch members clear an opening in the disk drive assembly housing (i.e., such that the lever disengages from the housing), and (iii) pull the lever away from the housing such that the lever pivots around the horizontal pivot axis. Often, the user must perform these maneuvers using only a thumb and forefinger to grip the pinch members. Accordingly, such movements generally require the user to possess considerable strength and dexterity skills (e.g., hand and wrist strength and coordination) in order to operate the lever properly.

In contrast to the above-described conventional pinch-type latch mechanism, the present invention is directed to latching techniques that respond to more ergonomically pleasing user movements, and that are well-suited for maintaining low manufacturing costs.

One arrangement of the invention is directed to a disk drive assembly having a housing, a disk drive attached to the housing, and a lever that secures the housing to and releases the housing from a main assembly. The lever includes a frame that is pivotably coupled to the housing at a pivot point that defines a pivot axis. The lever further includes a latch that is coupled to the frame. The latch selectively engages with the housing and disengages from the housing. The latch includes an actuation portion that requires movement in a direction along an axis that is substantially perpendicular to the pivot axis to disengage the latch from the housing. Accordingly, if the pivot axis is horizontally-oriented, a user can move the actuation portion in a substantially vertical direction (e.g., downward) in an ergonomically convenient manner to disengage the latch from the housing.

In one arrangement, the actuation portion requires movement in a direction (e.g., downward, or downward and slightly outward) towards the pivot axis to disengage the latch from the housing. Accordingly, if the pivot axis is disposed along a lower edge of the disk drive assembly, the user can simply pull the actuation portion in a substantially downward direction using any number of fingers to disengage the latch from the housing and to move the lever away from the housing. Such movement is relatively simple and requires little concentration.

In one arrangement, the actuation portion requires movement in substantially a single direction relative to the frame to disengage the latch from the housing. For example, the actuation portion can require the user to provide a downward de-latching motion, or a downward and slightly outward de-latching motion. This arrangement requires less dexterity (e.g., hand and wrist strength and coordination) than conventional spring-loaded, pinch-type latch mechanisms that require movement in multiple directions (e.g., moving pinch-type members toward each other) to disengage the pinch-type latch mechanism from a housing.

In one arrangement, the actuation portion includes a paddle that is movable relative to the frame in response to an actuation force, and an inner portion that extends between the paddle and an attachment point of the frame. The inner portion distorts when the paddle moves in response to the actuation force. Additionally, the inner portion includes a ridge (e.g., provided by a tab) which applies friction against a portion of the housing when the latch engages with the housing. This arrangement requires less individually separated parts than a conventional spring-loaded pinch-type latch mechanism which has multiple pinch-type members and a small spring. Accordingly, a lever that uses this arrangement of the invention is generally simpler and less costly to manufacture than a lever that uses the above-described conventional spring-loaded pinch-type latch mechanism.

In one arrangement, the frame defines a frame opening, and the actuation portion includes a paddle that (i) is movable relative to the frame in response to an actuation force, and (ii) extends through the frame opening. The actuation portion further includes a curved inner portion that extends from the frame and rigidly attaches with the paddle. The use of such a curved inner portion alleviates the need for a small spring as in conventional spring-loaded pinch-type latch mechanisms thus enabling this arrangement to be simpler and less expensive to assemble than arrangements that use conventional spring-loaded, pinch-type latch mechanisms.

In one arrangement, the frame defines a frame opening, and the actuation portion is a solid contiguous material that (i) rigidly attaches to the frame, (ii) extends from the frame through the frame opening and (iii) is movable relative to the frame in response to an actuation force. Accordingly, the latch requires no individually separated parts or components (e.g., pinch-type members, springs, etc.) which could otherwise increase the operating complexity and manufacturing cost of the lever and the disk drive assembly.

In one arrangement, the frame includes multiple support tabs adjacent the frame opening to prevent distortion of the actuation portion when the latch moves to engage with the housing and disengage from the housing. This arrangement provides safeguards against damage due to stresses on the actuation portion during normal operation (e.g., installation or removal of the disk drive assembly).

Another arrangement of the invention is directed to a data storage system that includes a main assembly and a disk drive assembly. The main assembly has a supporting structure and a connector fastened to the supporting structure. The disk drive assembly includes a housing, a disk drive attached to the housing, and a lever that secures the housing to and releases the housing from a main assembly to enable the disk drive to respectively connect to and disconnect from the connector of the main assembly. The lever includes a frame pivotably coupled to the housing at a pivot point that defines a pivot axis, and a latch coupled to the frame. The latch selectively engages with the housing and disengages from the housing. The latch has an actuation portion that requires movement in a direction along an axis that is substantially perpendicular to the pivot axis to disengage the latch from the housing.

The features of the invention, as described above, may be employed in data storage systems and other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for securing and releasing a disk drive assembly with a main assembly using a lever having a latch that responds to ergonomically pleasing user movements. The techniques of the invention are in many ways ergonomically superior to conventional systems having levers that use spring-loaded, pinch-type latching mechanisms, and are well-suited to providing low manufacturing costs. The techniques of the invention may be employed in data storage systems, as well as other computer-related systems and devices, such as those manufactured by EMC Corporation of Hopkinton, Mass.

Figure 3:
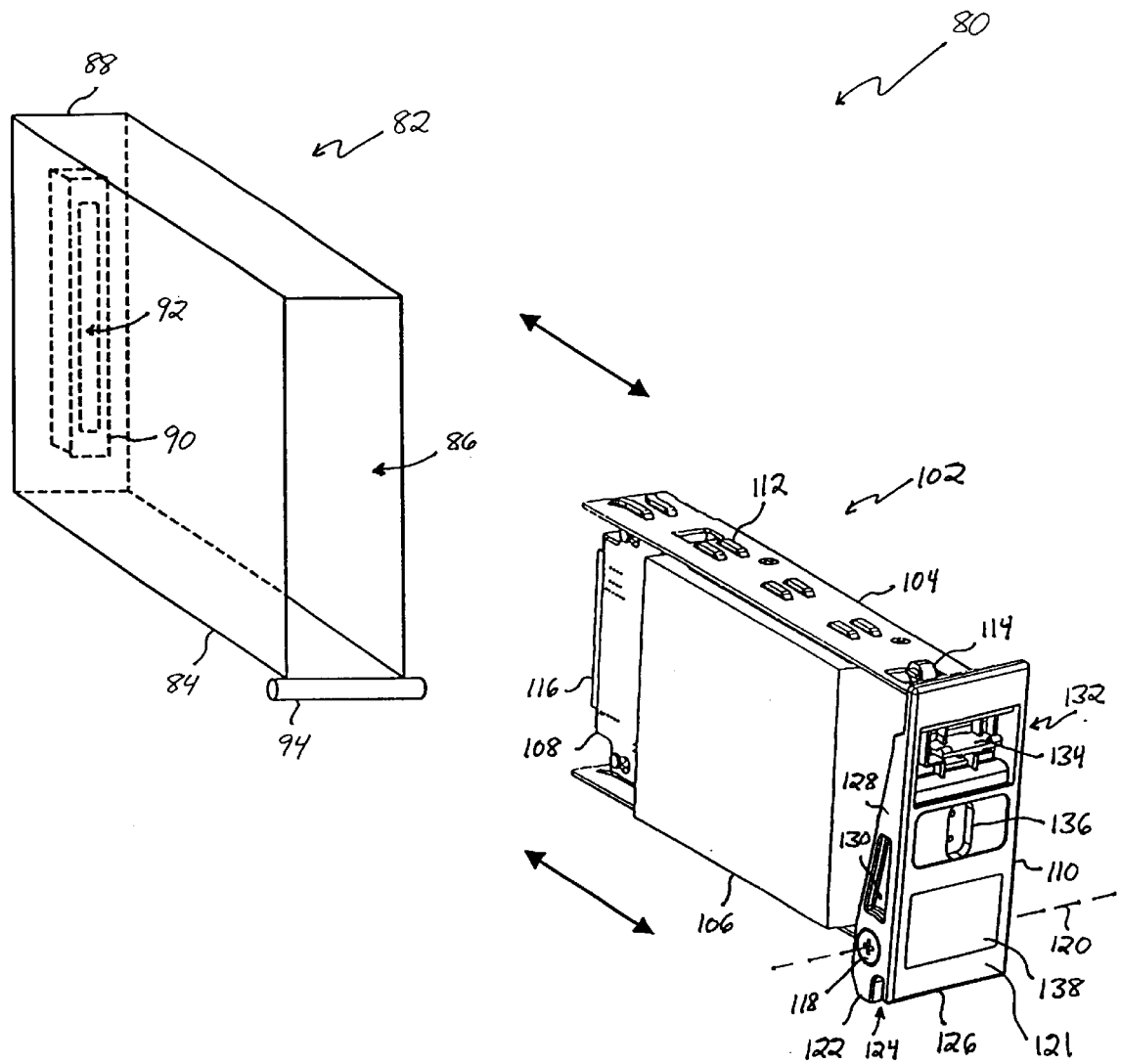
FIG. 3 shows a perspective view of a data storage system that includes a main assembly and a disk drive assembly having an ergonomically designed latch mechanism for securing the disk drive assembly to and releasing the disk drive assembly from the main assembly.

FIG. 3 shows a data storage system 80 which is suitable for use by the invention. The data storage system 80 includes a main assembly 82 and a disk drive assembly 102. The main assembly 82 is similar to the main assembly 24 of FIG. 1 in that the main assembly 82 includes a support structure 84 (e.g., a metallic housing) that defines (i) an opening 86 through which the disk drive assembly 102 enters and exits, and (ii) a back end 88. The main assembly 82 further includes, among other things, a connector 90 which mounts to the back end 88 of the support structure 84, and a post 94 (e.g., a bar) which fastens to a side (or edge) of the support structure opening 86. The connector 90 includes a slot 92 which mates with a portion of the disk drive assembly 102.

The disk drive assembly 102 includes a housing 104, a disk drive 106, a daughter card 108 and a lever 110. The housing 104 includes guides 112, 114 which facilitate motion of the housing disk drive assembly 102 within the main assembly 82. The daughter card 108 includes a connecting portion 116 having contacts which correspond to contacts within the connector 90 of the main assembly 82 such that when the disk drive assembly 102 is installed within the main assembly 82, the daughter card can communicate with other devices (e.g., a computer processor) through the connector 40. The daughter card 108 operates as an interface between these other devices and the disk drive 106.

The lever 110 includes hardware 118 which pivotably mounts the lever 110 to the housing 104. The hardware 118 (e.g., screws and threaded anchors) holds the lever 110 in place relative to the housing 104 but allows the lever 110 to rotate or pivot around a horizontally-oriented pivot axis 120.

The lever 110 further includes a frame 121 having a lower edge 126 and laterally disposed sides 128 (left and right). Each side 128 includes a cored area 130 and a large finger 122 that defines, in combination with the lower edge 126 of the frame 121, a groove 124 adjacent the bottom of the lever 110.

The lever 110 further includes a latch 132 having a paddle 134 that is movable relative to the frame 121, and an area 136 which is capable of supporting an LED assembly (not shown) to provide operation information to a user when the disk drive assembly 102 is installed within the main assembly 82 and in operation. Further details of the lever 110 will now be described with reference to FIGS. 4 and 5.

Figure 4:
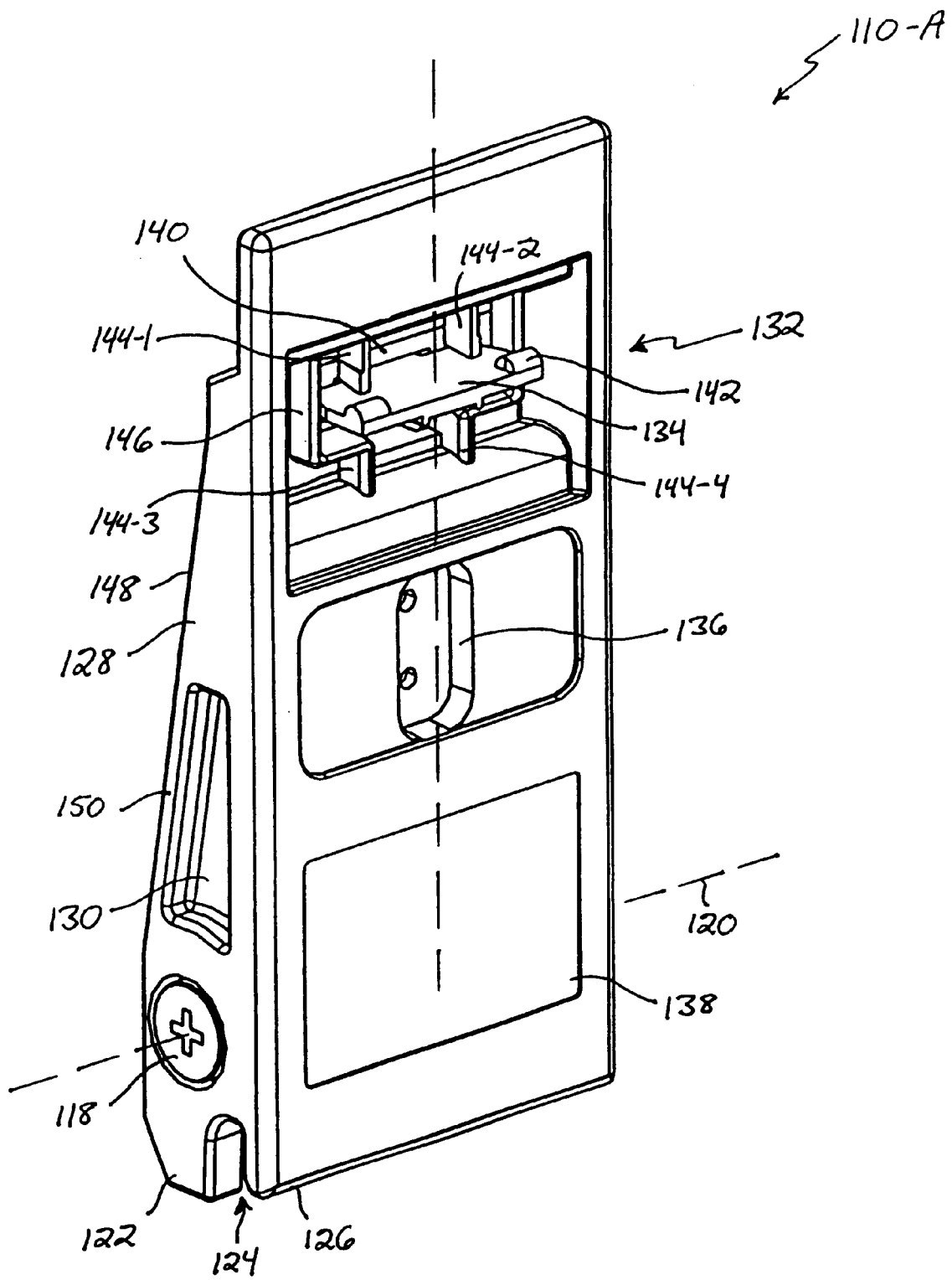
FIG. 4 is a perspective front/side view of a lever of the disk drive assembly of FIG. 3.

FIG. 4 shows a perspective front/side view 110-A of the lever 110. The frame 121 defines a frame opening 140, and the paddle 134 of the latch 132 extends through the frame opening 140. Additionally, the paddle 134 includes paddle tabs 142 that assist a user in aligning one or more of the user's fingers on a top surface of the paddle 134 when the user attempts to actuate the latch by applying force on the paddle 134. As further shown in FIG. 4, the frame 121 further defines multiple tabs 144-1, 144-2, 144-3 and 144-4 (collectively, tabs 144) adjacent the frame opening 140. The tabs 144 restrain movement of the paddle 134 to prevent severe distortion of the paddle 134 during lever operation. For example, tabs 144-3 and 144-4 prevent the paddle 134 from being pushed down too far to a point that could cause distortion. As another example, if there is force or torque on the lever 110 that tends to raise the paddle 134, the tabs 144-1 and 144-2 prevent the paddle 134 from moving too far in the upward direction. The frame 121 further defines frame opening walls 146 (i.e., vertical frames) which provide structural strength for the frame 121 to prevent distortion in the left and right directions.

Figure 1:
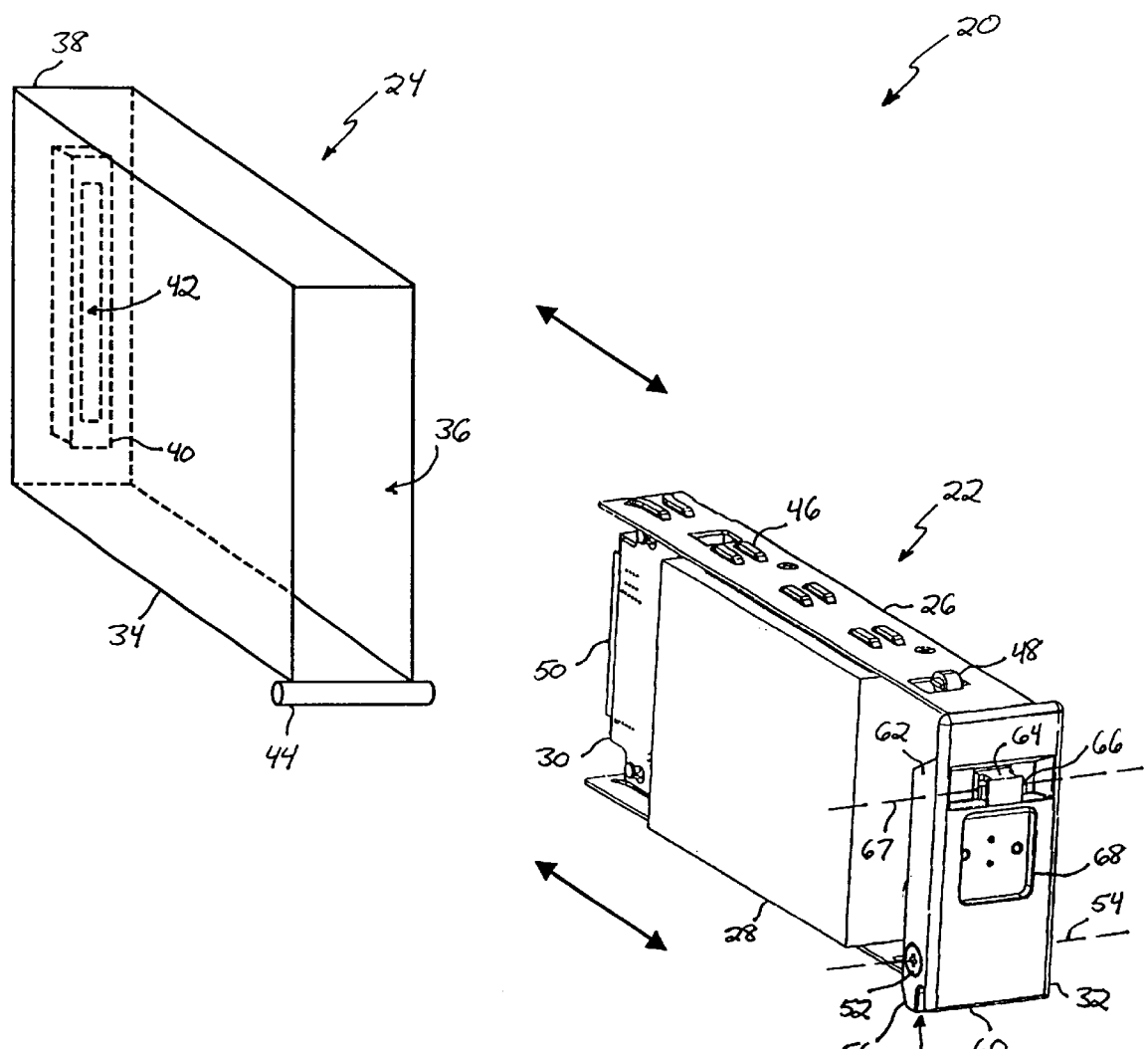
FIG. 1 shows a perspective view of a conventional data storage system that includes a main assembly and a disk drive assembly having a spring-loaded, pinch-type latch mechanism for securing the disk drive assembly to and releasing the disk drive assembly from the main assembly.
Figure 2A:
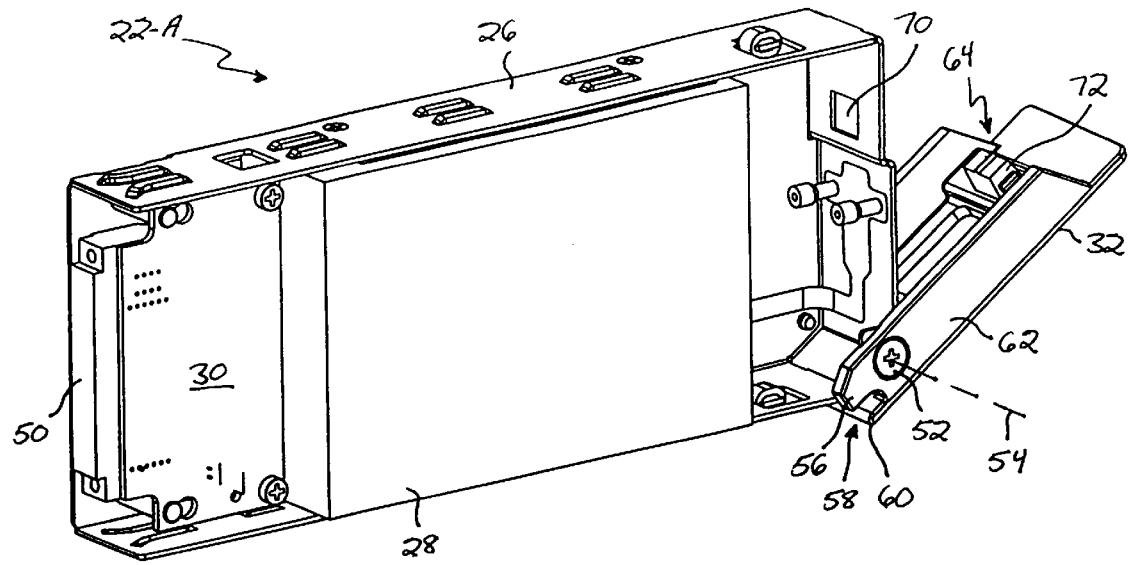
FIG. 2A shows a perspective view of the conventional disk drive assembly of FIG. 1 when the latch mechanism is in a released configuration.
Figure 2B:
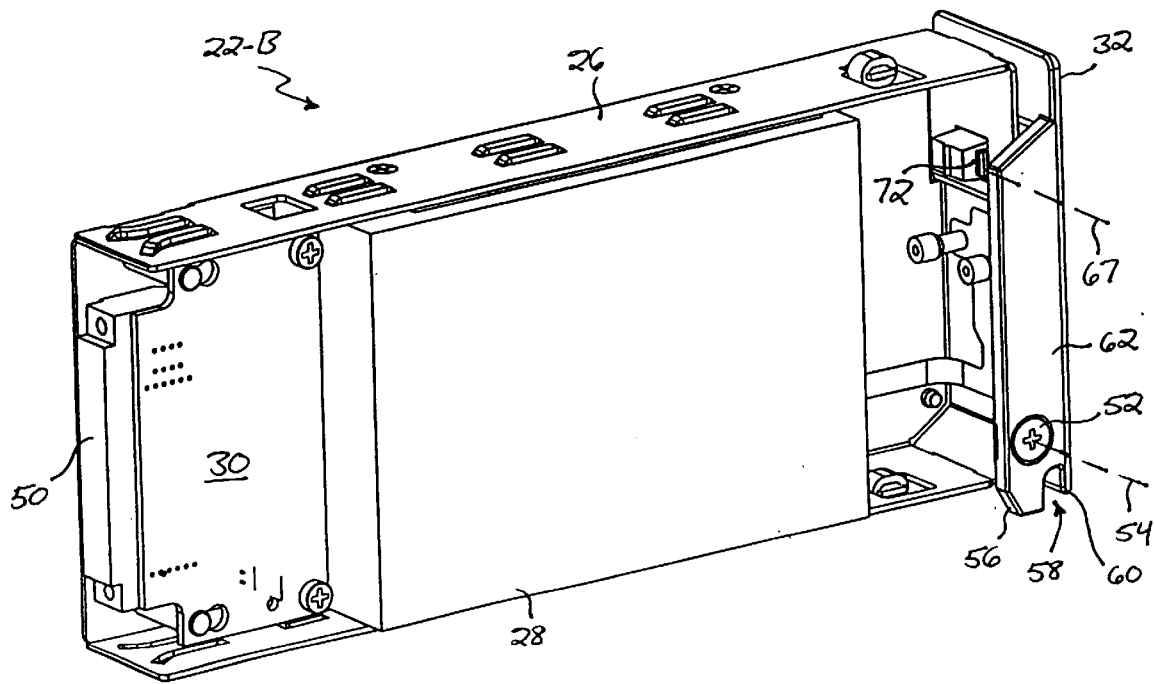
FIG. 2B shows a perspective view of the conventional disk drive assembly of FIG. 1 when the latch mechanism is in a secured configuration.

As further shown in FIG. 4, each lateral side 128 of the frame 121 has an edge 148 that is tapered to a greater extent than the conventional lever 32 (see FIGS. 1, 2A and 2B). The edge 148 includes a portion 150 that defines one side of the cored area 130, and provides structural strength to the edge 148. The inclusion of the tapered edge 148 and cored area 130 enable the lever 110 to be manufactured in less time and at a lower cost. In particular, the tapering of the edge 148 and coring of the area 130 reduces the amount of material (e.g., plastic) required for the lever 110 thus reducing the part weight of the lever 110 and decreasing the cooling cycle time for the lever 110 following a molding process. As a result, cooling time is low, manufacturing throughput is high, and manufacturing costs are kept low.

Figure 5:
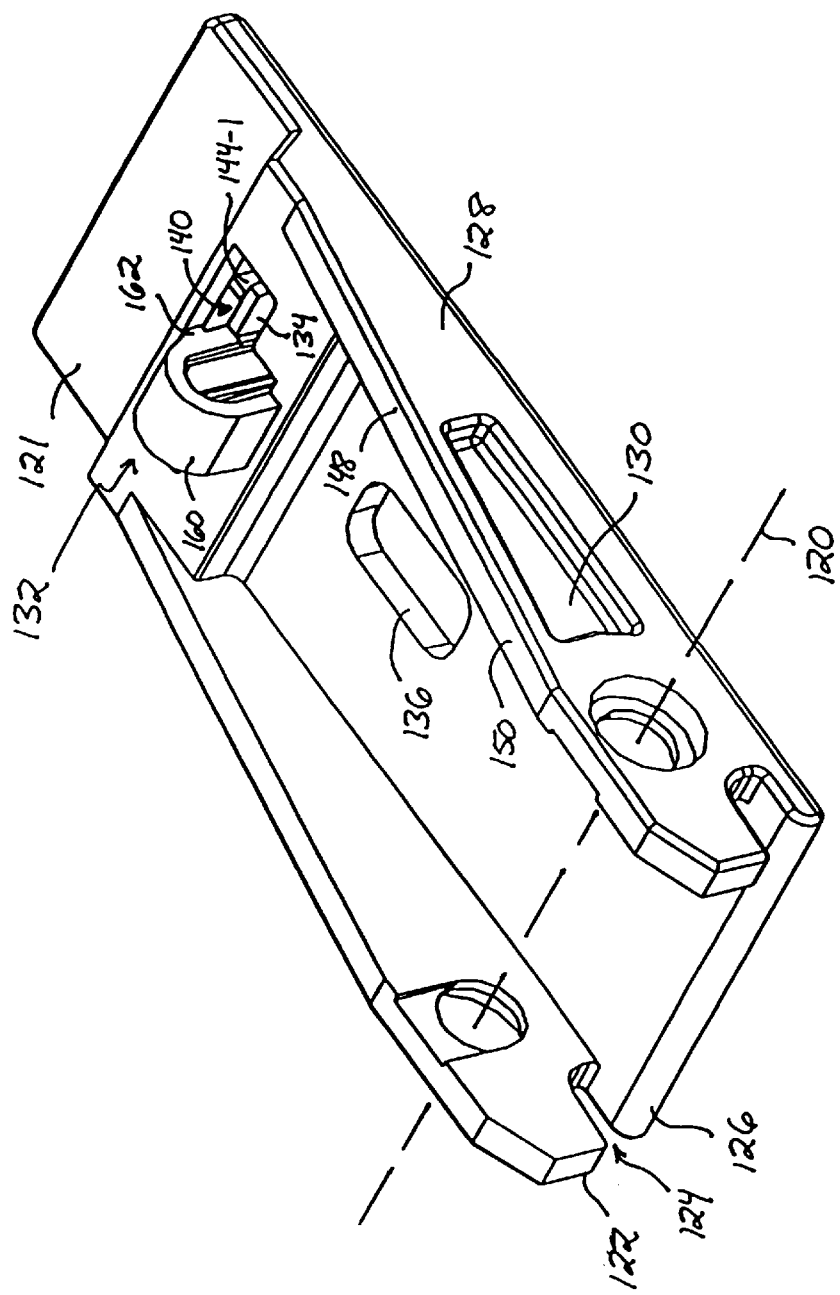
FIG. 5 is a perspective back/side view of the lever of the disk drive assembly of FIG. 3.

FIG. 5 shows a perspective back/side view 110-B of the lever 110. As shown in FIG. 5, the latch 132 further includes an inner portion 160 that extends from the frame 121 to the paddle 134. The inner portion 162 includes a tab 162. The paddle 134 and inner portion 160 form an actuation portion of the latch 132 which is movable when a user applies force to the paddle 134 along an axis 164 that is substantially perpendicular (e.g., at 90 degrees +/−20%) to the pivot axis 120 (see FIG. 4). Preferably, the actuation portion formed by the paddle 134 and the inner portion 160 is solid contiguous material that (i) rigidly attaches to the frame 121, (ii) extends from the frame 121 through the opening 140 defined by the frame 121 and (iii) is movable relative to the frame 121 in response to the user actuation force. In one arrangement, the actuation portion is formed of the same material as the frame 121 at the same time the frame 121 is formed such that the combination of the frame 121 and the actuation portion (the inner portion 160 and paddle 132) is a contiguous solid piece of material (e.g., plastic). Further details of the invention will now be described with reference to FIGS. 6A and 6B.

Figure 6A:
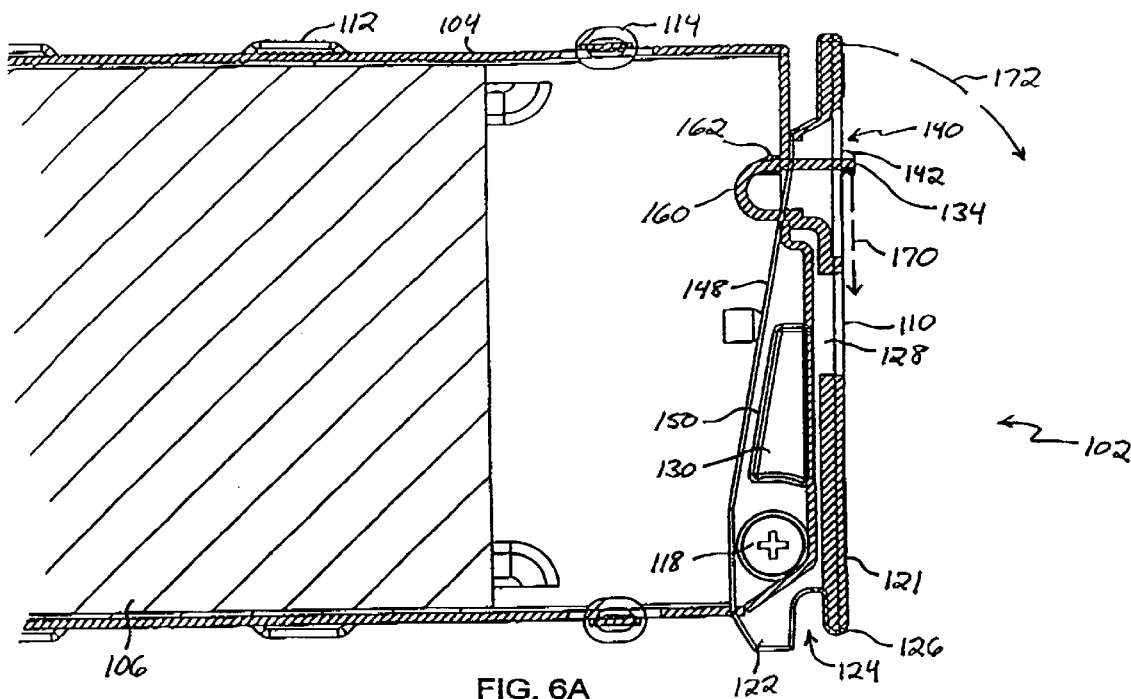
FIG. 6A shows a side view of a portion of the disk drive assembly of FIG. 3 when the latch mechanism is disengaged from a housing of the disk drive assembly.

As shown in FIG. 6A, the housing 104 defines a housing opening 166 having a shape (e.g., a rectangular shape) that is suitable for receiving the inner portion 160 of the latch 132. In this configuration, the disk drive assembly 104 is ready for installation within the main assembly 82 (also see FIG. 1).

To install the disk drive assembly 102 within the main assembly 82 (also see FIG. 3), a user inserts the disk drive assembly 102 into the support structure opening 86 of the main assembly 82. The housing guides 112, 114 facilitate motion of the housing 104 within the support structure 84. In particular, the guides 112 align with corresponding guides within support structure 84 to properly align the disk drive assembly 102 within the main assembly 82. Furthermore, the guides 114 (and the guides 112 to some extent) reduce friction between surfaces of the disk drive assembly housing 104 and the main assembly support structure 84.

The user slides the disk drive assembly 102 toward the back end 88 of the support structure 84 until the grooves 124 (defined by the large fingers 122 and the lower end 126 of the frame 121) engage with the post 94 of the main assembly 82.

Then, the user operates the lever 110 to mate the disk drive assembly 102 with the main assembly 82. In particular, the user rotates the lever 110 in the direction shown by dashed arrow 168 of FIG. 6A. As the user moves the lever 110 toward the housing 104, the large fingers 122 of the lever 110 grab the post 94 (FIG. 3) thus enabling the lever 110 to provide leverage to move the housing 104 further into the support structure 84 such that the connecting portion 116 of the daughter card 108 properly mates with the connector 90 in a controlled and consistent manner. As the daughter card 108 mates with the connector 90, the inner portion 160 of the lever 110 passes through the housing opening 166. Friction from the housing 104 (i.e., the top edge of the opening 166) pushes against the tab 162 of the inner portion 160 to compress the inner portion 160 until the tab 162 fully passes through the housing opening 166. Once the tab 162 passes the housing opening 166, the inner portion 160 decompresses back to its original shape.

Figure 6B:
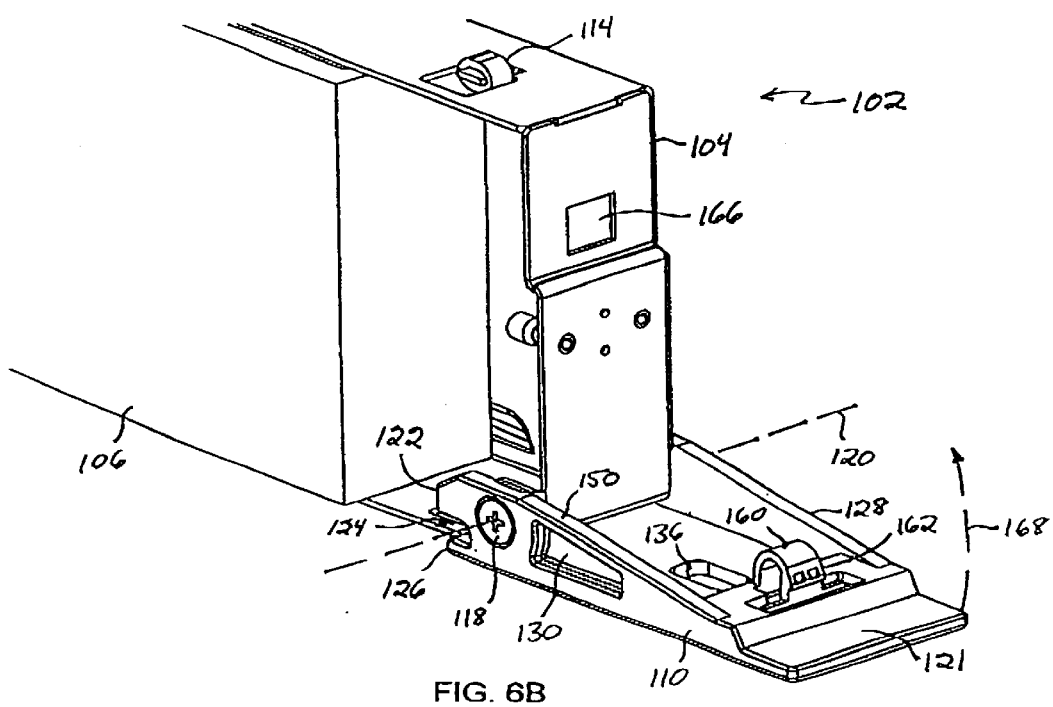
FIG. 6B shows a perspective view of a portion of the disk drive assembly of FIG. 3 when the latch mechanism is engaged with the housing of the disk drive assembly.

FIG. 6B shows the position of the lever 110 relative to the housing 104 once the tab 162 has passed completely through the housing opening 166. The inner portion 160 of the lever 132 extends from an attachment point with the frame 121, through the housing opening 166, and back through the housing opening 166 to an attachment point with the paddle 134.

It should be understood that the extent of deformation of the inner portion 160 during installation is not severe enough to damage (e.g., permanently distort or break) the inner portion 160. Rather, once the tab 162 passes through the housing opening 166, the inner portion 160 returns to its original position thus pushing the tab 162 above the opening 166 and preventing the lever 110 from rotating away from the housing 104. That is, the tab 162 of the inner portion 160 applies friction against the top edge of the housing opening 166 to prevent the lever 110 from inadvertently disengaging from the housing 104 in the absence of an actuation force on the paddle 134. Accordingly, the disk drive assembly 102 is now secured to the main assembly 82, and the lever 110 is locked to the housing 104. As such, the lever 110 is prevented from pivoting around the pivot axis 120. Additionally, the large fingers 122 of the lever 110 extend against the post 94 preventing the disk drive assembly 102 from inadvertently disconnecting from the main assembly 82 (e.g., due to vibration).

When the disk drive assembly 102 is properly installed within the main assembly 82, contacts along the connecting portion 116 of the daughter card 108 make electrical contact with corresponding contacts within the connector 90. In this mated position, the disk drive assembly 102 is capable of receiving power and communicating with other devices (e.g., a computer processor) through the connector 90 in order to perform data storage and retrieval operations. The daughter card 108 operates as an interface between the other devices and the disk drive 106. Further details of how the disk drive assembly 102 removes from the main assembly 82 will now be provided with reference to FIGS. 7, 8A and 8B.

Figure 7:
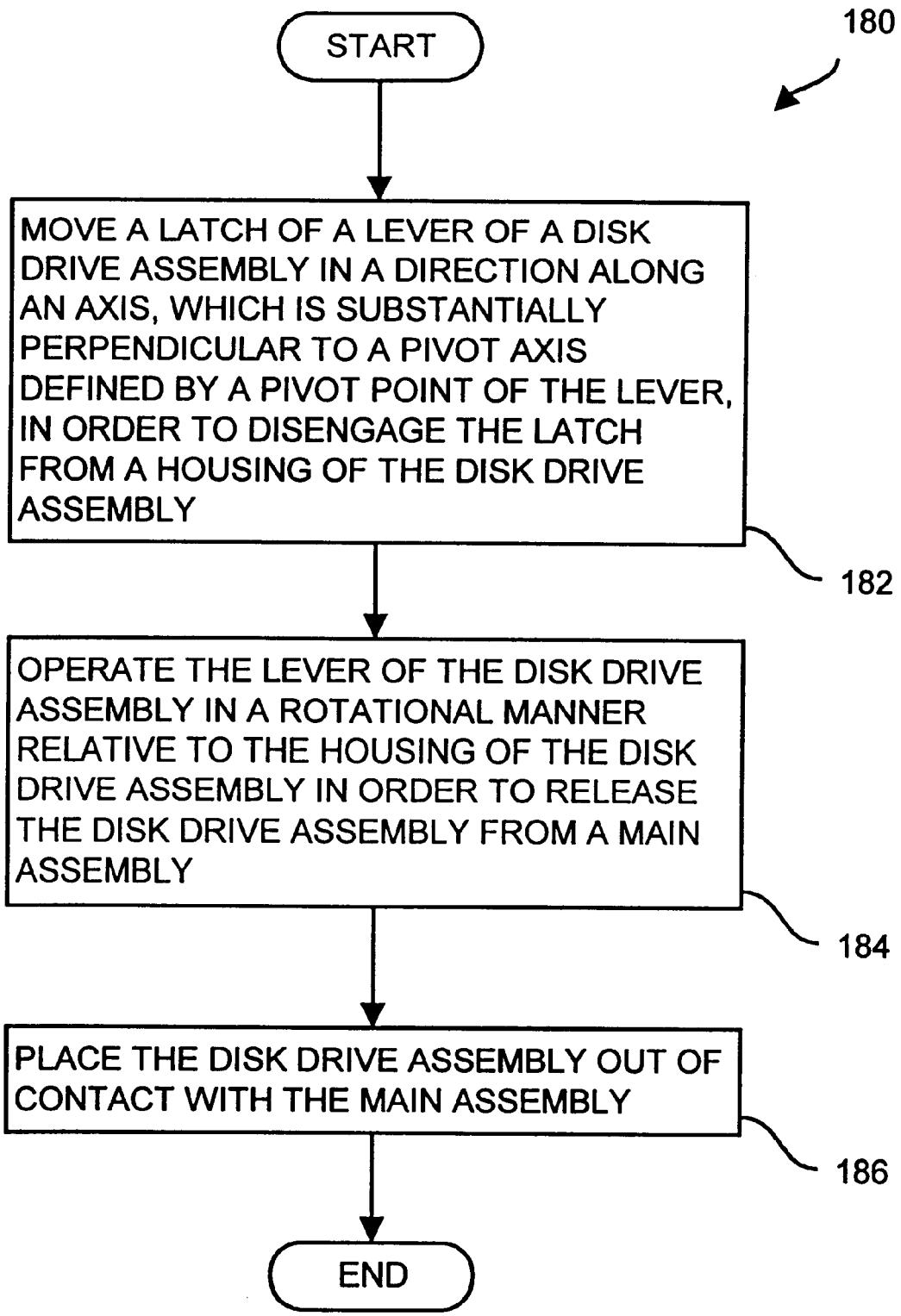
FIG. 7 is a flow diagram of a procedure for releasing the disk drive assembly of FIG. 3 from a main assembly.
Figure 8A:
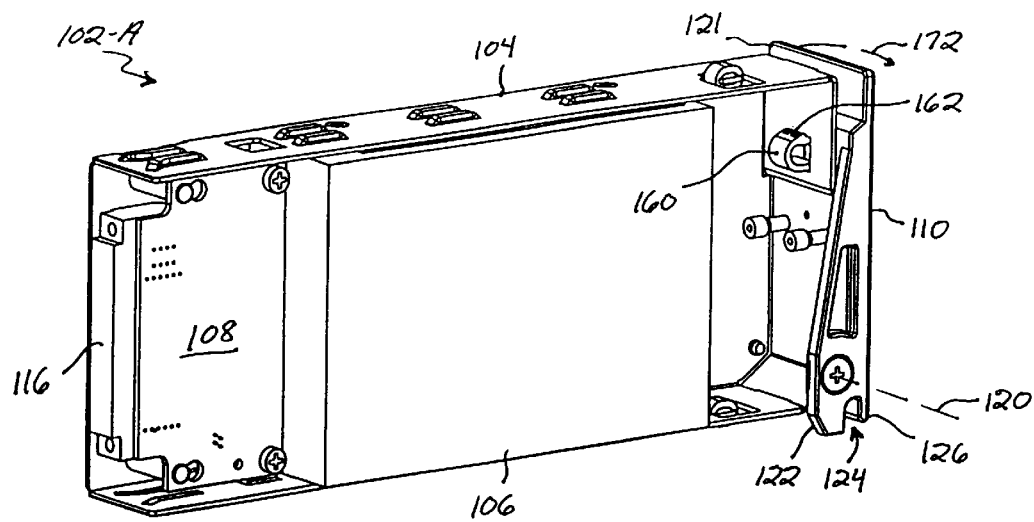
FIG. 8A shows a perspective view of the disk drive assembly of FIG. 3 when the latch mechanism is in a secured configuration.
Figure 8B:
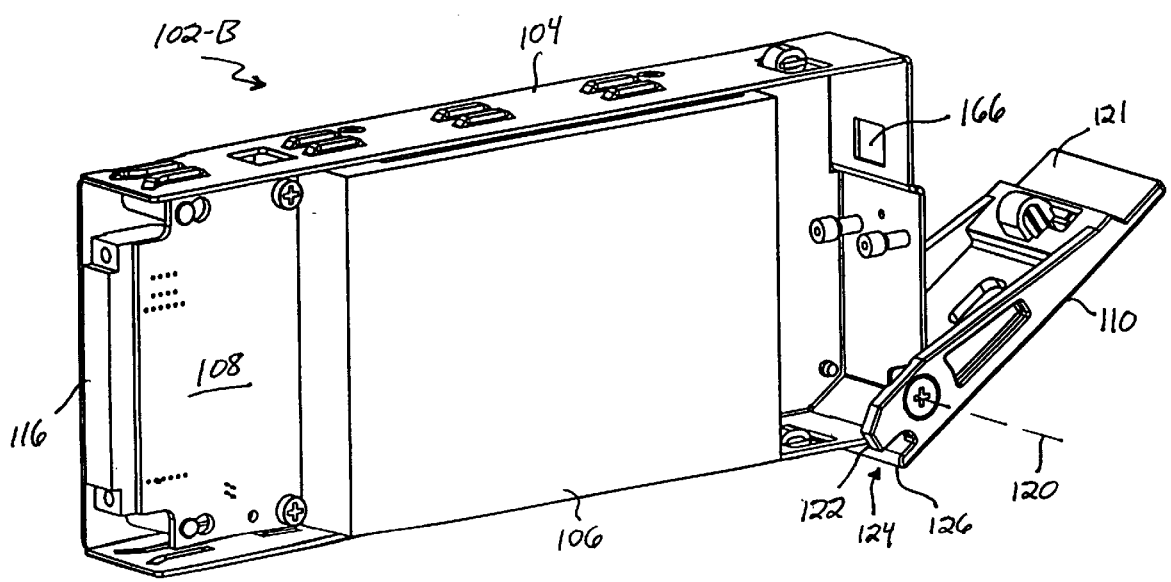
FIG. 8B shows a perspective view of the disk drive assembly of FIG. 3 when the latch mechanism is in a released configuration.

FIG. 7 shows a procedure 180 which a user performs on the data storage system 80 to remove the disk drive assembly 102 from the main assembly 82. Initially, the disk drive assembly 102 is installed within the main assembly 82, and the lever 110 is engaged with the disk drive assembly housing 104, as shown in FIG. 8A. In step 182, the user moves the latch 132 of the lever 110 in a direction 164 (also see FIG. 4) along an axis that is substantially perpendicular to the pivot axis 120 of the lever 110. In particular, the user applies a force to the paddle 132 toward the pivot axis 120 (i.e., a downward force) as shown by the dashed arrow 170 in FIG. 6B. This downward de-latching motion is more natural for the user than complex hand maneuvers required by conventional pinch-type latching mechanisms for disk drive assembly removal. In response, the inner portion 160 compresses and the latch 132 disengages from the housing 104. That is, the force on the paddle 132 distorts the inner portion 160 such that the tab 162 no longer applies friction against the edge of the housing opening 166 thus disengaging the latch 132 from the housing 104.

In step 184, the user operates the lever 110 in a rotational manner relative to the housing 104 to pivot the lever 110 away from the housing 104, as shown by the dashed arrow 172 in FIG. 8A. In response, the lever 110 pivots away from the housing 104. As this occurs, the edge 126 of the lever 110 pushes against the main assembly post 94 to move the disk drive assembly 102 away from the back end 88 of the support structure 44 in a controlled and consistent manner. Accordingly, the portion 116 of the daughter card 108 disconnects from the slot 92 of the connector 90 and is free to slide within the main assembly 82. The lever 110 is now generally in the position shown in FIG. 8B.

It should be understood that, during step 184, the user maintains a force on the paddle 132 in approximately the same direction (e.g., downward and slightly outward). Accordingly, the user is not required to provide any change in movement that requires significant dexterity or strength or less natural movement. Thus, the operation of the lever 110 is more ergonomically appealing to the user than a conventional lever having pinch-type latch mechanism that requires the user's hand to simultaneously squeeze pinch members and pull on the pinch members to remove a disk drive assembly.

In step 186, the user places the disk drive assembly 102 out of contact with the main assembly 82. In particular, the user slides the disk drive assembly 102 fully out of the main assembly opening 86. The disk drive assembly 102 is now completely removed from the main assembly 82.

It should be understood that some maintenance situations require the user to install or remove several disk drive assemblies 102 in a row (e.g., into or out of one or more rows or columns of side-by-side main assemblies 82). In this situation, the user simply pulls down on the paddle 132 of each disk drive assembly 102 to be removed until the lever 110 of that disk drive assembly 102 disengages from the disk drive assembly housing 104 (see FIG. 8B). At this point, the daughter card 108 of each disk drive assembly 102 is disconnected from its corresponding connector 90, and each disk drive assembly 102 is free to slide within its corresponding main assembly 82. Accordingly, the user can then remove the disk drive assemblies 102 by sliding each disk drive assembly 102 fully out of its corresponding main assembly 82. Thus, the user can remove multiple disk drive assemblies 102 quickly and conveniently with less fatigue and discomfort than that caused by operating conventional pinch-type mechanisms on a repetitive basis.

The features of the invention may be particularly useful when applied to devices manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the post 94 is not essential to the main assembly 94. Rather, the support structure 84 can extend to provide a surface for engaging the grooves 124 of the lever 132. In one arrangement, the support structure 84 simply provides two tabs (e.g., curve metallic tabs for strength) that engage the grooves 124. In another arrangement, the bottom of the support structure 84 (i) is wide enough to define one or more openings that receive the large fingers 122 and (ii) is configured to provide one or more edges (along the openings) that engage the grooves 124.

Additionally, it should be understood that the support structure 84 was described as a metallic housing by way of example only. Other materials are suitable for the support structure 84 such as fiberglass, plastic, etc. Moreover, the support structure 84 can take several forms such as a cage, a rack, a platform, etc.

Furthermore, it should be understood that the pivot axis 120 is described as being horizontally-oriented and located at the bottom of the disk drive assembly 102 by way of example only. In alternative arrangements, the pivot axis 120 (and associated hardware 118) can be disposed in a different location such as vertically on a lateral side of the housing 104 or horizontally on the top edge of the housing 104.

Additionally, it should be understood that the lever 110 can be made of a variety of materials. In one arrangement, the lever 110 is molded out of plastic. Alternatively, the lever 110 is formed of a different material or multiple materials such as fiberglass, rubber coated metal, etc.

What is claimed is:

1. A disk drive assembly, comprising:
    a housing;
    a disk drive attached to the housing; and
    a lever that secures the housing to and releases the housing from a main assembly, the lever including:
        a frame pivotably coupled to the housing at a pivot point that defines a pivot axis, and
        a latch, coupled to the frame, that selectively engages with the housing and disengages from the housing, the latch having an actuation portion that requires movement in a direction along an axis that is substantially perpendicular to the pivot axis to disengage the latch from the housing.

2. The disk drive assembly of claim 1 wherein the actuation portion requires movement in a direction towards the pivot axis to disengage the latch from the housing.

3. The disk drive assembly of claim 1 wherein the actuation portion requires movement in substantially a single direction relative to the frame to disengage the latch from the housing.

4. The disk drive assembly of claim 1 wherein the actuation portion includes:
    a paddle that is movable relative to the frame in response to an actuation force; and
    an inner portion that extends between the paddle and an attachment point of the frame, the inner portion distorting when the paddle moves in response to the actuation force, and the inner portion including a ridge which applies friction against a portion of the housing when the latch engages with the housing.

5. The disk drive assembly of claim 1 wherein the frame defines an opening, and wherein the actuation portion includes:
    a paddle that (i) is movable relative to the frame in response to an actuation force and (ii) extends through the opening defined by the frame; and
    a curved inner portion that extends from the frame and rigidly attaches with the paddle.

6. The disk drive assembly of claim 1 wherein the frame defines an opening, and wherein the actuation portion is a solid contiguous material that (i) rigidly attaches to the frame, (ii) extends from the frame through the opening defined by the frame and (iii) is movable relative to the frame in response to an actuation force.

7. The disk drive assembly of claim 6 wherein the frame includes multiple support tabs adjacent the opening to prevent distortion of the actuation portion when the latch moves to engage with the housing and disengage from the housing.

8. A method for removing a disk drive assembly from a main assembly, the disk drive assembly including a housing and a lever coupled to the housing at a pivot point that defines a pivot axis, the method comprising the steps of:

moving a latch of the lever in a direction along an axis that is substantially perpendicular to the pivot axis to disengage the latch from the housing;

operating the lever in a rotational manner relative to the housing of the disk drive assembly to release the drive assembly from the main assembly; and placing the drive assembly out of contact with the main assembly.

9. The method of claim 8 wherein the step of moving includes the step of:

actuating the latch in a direction towards the pivot axis to disengage the latch from the housing.

10. The method of claim 8 wherein the lever further includes a frame pivotably coupled to the housing at the pivot point and supporting the latch, and wherein the step of moving includes the step of:

actuating the latch in substantially a single direction relative to the frame to disengage the latch from the housing.

11. The method of claim 8 wherein the lever further includes a frame pivotably coupled to the housing at the pivot point and supporting the latch, and wherein the step of moving includes the step of:

applying an actuation force to a paddle of the latch to move the paddle relative to the frame and to distort an inner portion of the latch that extends between the paddle and an attachment point of frame.

12. The method of claim 8 wherein the lever further includes a frame pivotably coupled to the housing at the pivot point and supporting the latch, wherein the frame defines an opening, and wherein the step of moving includes the step of:

applying an actuation force to an actuation portion of the level formed of solid contiguous material that (i) rigidly attaches to the frame, (ii) extends from the frame through the opening defined by the frame and (iii) is movable relative to the frame in response to the actuation force.

13. A lever for securing a disk drive assembly to and releasing the disk drive assembly from a main assembly, the lever comprising:

a frame that pivotably couples to a housing of the disk drive assembly at a pivot point which defines a pivot axis, and a latch, coupled to the frame, that selectively engages with the housing and disengages from the housing when the frame is pivotably coupled to the housing at the pivot point, the latch having an actuation portion that requires movement in a direction along an axis that is substantially perpendicular to the pivot axis to disengage the latch from the housing when the frame is pivotably coupled to the housing at the pivot point.

14. The lever of claim 13 wherein the actuation portion requires movement in a direction towards the pivot axis to disengage the latch from the housing when the frame is pivotably coupled to the housing at the pivot point.

15. The lever of claim 13 wherein the actuation portion requires movement in substantially a single direction relative to the frame to disengage the latch from the housing when the frame is pivotably coupled to the housing at the pivot point.

16. The lever of claim 13 wherein the actuation portion includes:

a paddle that is movable relative to the frame in response to an actuation force; and an inner portion that extends between the paddle and an attachment point of the frame, the inner portion distorting when the paddle end moves in response to the actuation force, and the inner portion including a ridge which applies friction against a portion of the housing when (i) the frame is pivotably coupled to the housing at the pivot point and (ii) the latch engages with the housing.

17. The lever of claim 13 wherein the frame defines an opening, and wherein the actuation portion includes:

a paddle that (i) is movable relative to the frame in response to an actuation force and (ii) extends through the opening defined by the frame; and a curved inner portion that extends from the frame and rigidly attaches with the paddle.

18. The lever of claim 13 wherein the frame defines an opening, and wherein the actuation portion is a solid contiguous material that (i) rigidly attaches to the frame, (ii) extends from the frame through the opening defined by the frame and (iii) is movable relative to the frame in response to an actuation force.

19. The lever of claim 18 wherein the frame includes multiple support tabs adjacent the opening to prevent distortion of the actuation portion when (i) the frame is pivotably coupled to the housing at the pivot point and (ii) the latch moves to engage with the housing and disengage from the housing.

20. A data storage system, comprising:

a main assembly having supporting structure and a connector fastened to the supporting structure; and a disk drive assembly having a housing, a disk drive attached to the housing, and a lever that secures the housing to and releases the housing from a main assembly to enable the disk drive to respectively connect to and disconnect from the connector of the main assembly, the lever including:

a frame pivotably coupled to the housing at a pivot point that defines a pivot axis, and a latch, coupled to the frame, that selectively engages with the housing and disengages from the housing, the latch having an actuation portion that requires movement in a direction along an axis that is substantially perpendicular to the pivot axis to disengage the latch from the housing.

* * * * *